(12) United States Patent
Khadiwala

(10) Patent No.: US 10,353,774 B2
(45) Date of Patent: Jul. 16, 2019

(54) UTILIZING STORAGE UNIT LATENCY DATA IN A DISPERSED STORAGE NETWORK

(71) Applicant: International Business Machines Corporation, Armonk, NY (US)

(72) Inventor: Ravi V. Khadiwala, Bartlett, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 497 days.

(21) Appl. No.: 15/244,354

(22) Filed: Aug. 23, 2016

(65) Prior Publication Data

US 2017/0126794 A1    May 4, 2017

Related U.S. Application Data

(60) Provisional application No. 62/248,752, filed on Oct. 30, 2015.

(51) Int. Cl.
*G06F 11/10* (2006.01)
*G06F 3/06* (2006.01)
(Continued)

(52) U.S. Cl.
CPC .......... *G06F 11/1092* (2013.01); *G06F 3/061* (2013.01); *G06F 3/064* (2013.01);
(Continued)

(58) Field of Classification Search
CPC .. G06F 11/1092; G06F 3/0604; G06F 3/0611; G06F 3/0619; G06F 3/064;
(Continued)

(56) References Cited

U.S. PATENT DOCUMENTS

| 4,092,732 A | 5/1978 | Ouchi |
| 5,454,101 A | 9/1995 | Mackay et al. |

(Continued)

OTHER PUBLICATIONS

Shamir; How to Share a Secret; Communications of the ACM; vol. 22, No. 11; Nov. 1979; pp. 612-613.

(Continued)

*Primary Examiner* — Chris Parry
*Assistant Examiner* — Chouat Abderrahmen
(74) *Attorney, Agent, or Firm* — Garlick & Markison; Timothy W. Markison; Bruce E. Stuckman

(57) ABSTRACT

A method for execution by a dispersed storage and task (DST) processing unit includes generating a first access request for transmission via a network to a first one of a plurality of storage units in a dispersed storage network (DSN). A first access response is received via the network from the first one of the plurality of storage units that includes a first access time duration. Access duration data is updated to include the first access time duration received from the first one of the plurality of storage units. A subset of storage units is selected from the plurality of storage units based on comparing a plurality of access time durations corresponding to the plurality of storage units included in the access duration data to perform a second data access. At least one second access request is generated for transmission via the network to the subset of storage units.

17 Claims, 6 Drawing Sheets

(51) Int. Cl.

| | | |
|---|---|---|
| *H03M 13/15* | (2006.01) | |
| *H04L 12/26* | (2006.01) | |
| *H04L 29/08* | (2006.01) | |
| *G06F 11/20* | (2006.01) | |
| *H03M 13/37* | (2006.01) | |

(52) U.S. Cl.
CPC ............ *G06F 3/0604* (2013.01); *G06F 3/067* (2013.01); *G06F 3/0611* (2013.01); *G06F 3/0619* (2013.01); *G06F 3/0635* (2013.01); *G06F 3/0659* (2013.01); *G06F 3/0665* (2013.01); *G06F 3/0689* (2013.01); *G06F 11/2094* (2013.01); *H03M 13/1515* (2013.01); *H03M 13/3761* (2013.01); *H04L 43/0864* (2013.01); *H04L 43/0876* (2013.01); *H04L 43/16* (2013.01); *H04L 67/1008* (2013.01); *H04L 67/1097* (2013.01); *G06F 2201/805* (2013.01)

(58) Field of Classification Search
CPC ...... G06F 3/0659; G06F 3/0665; G06F 3/067; G06F 3/0689; G06F 11/2094; G06F 2201/805; H03M 13/1515; H03M 13/3761; H04L 43/0864; H04L 43/16; H04L 67/1008; H04L 67/1097
See application file for complete search history.

(56) References Cited

U.S. PATENT DOCUMENTS

| | | | |
|---|---|---|---|
| 5,485,474 | A | 1/1996 | Rabin |
| 5,774,643 | A | 6/1998 | Lubbers et al. |
| 5,802,364 | A | 9/1998 | Senator et al. |
| 5,809,285 | A | 9/1998 | Hilland |
| 5,890,156 | A | 3/1999 | Rekieta et al. |
| 5,987,622 | A | 11/1999 | Lo Verso et al. |
| 5,991,414 | A | 11/1999 | Garay et al. |
| 6,012,159 | A | 1/2000 | Fischer et al. |
| 6,058,454 | A | 5/2000 | Gerlach et al. |
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,449,688 | B1 | 9/2002 | Peters et al. |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,768 | B2 | 8/2004 | Peters et al. |
| 6,785,783 | B2 | 8/2004 | Buckland |
| 6,826,711 | B2 | 11/2004 | Moulton et al. |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,080,101 | B1 | 7/2006 | Watson et al. |
| 7,103,824 | B2 | 9/2006 | Halford |
| 7,103,915 | B2 | 9/2006 | Redlich et al. |
| 7,111,115 | B2 | 9/2006 | Peters et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,222,133 | B1 | 5/2007 | Raipurkar et al. |
| 7,240,236 | B2 | 7/2007 | Cutts et al. |
| 7,272,613 | B2 | 9/2007 | Sim et al. |
| 7,636,724 | B2 | 12/2009 | de la Torre et al. |
| 2002/0062422 | A1 | 5/2002 | Butterworth et al. |
| 2002/0166079 | A1 | 11/2002 | Ulrich et al. |
| 2003/0018927 | A1 | 1/2003 | Gadir et al. |
| 2003/0037261 | A1 | 2/2003 | Meffert et al. |
| 2003/0065617 | A1 | 4/2003 | Watkins et al. |
| 2003/0074486 | A1* | 4/2003 | Anastasiadis ............ H04L 29/06 719/321 |
| 2003/0084020 | A1 | 5/2003 | Shu |
| 2004/0024963 | A1 | 2/2004 | Talagala et al. |
| 2004/0122917 | A1 | 6/2004 | Menon et al. |
| 2004/0215998 | A1 | 10/2004 | Buxton et al. |
| 2004/0228493 | A1 | 11/2004 | Ma |
| 2005/0100022 | A1 | 5/2005 | Ramprashad |
| 2005/0114594 | A1 | 5/2005 | Corbett et al. |
| 2005/0125593 | A1 | 6/2005 | Karpoff et al. |
| 2005/0131993 | A1 | 6/2005 | Fatula |
| 2005/0132070 | A1 | 6/2005 | Redlich et al. |
| 2005/0144382 | A1 | 6/2005 | Schmisseur |
| 2005/0229069 | A1 | 10/2005 | Hassner et al. |
| 2006/0047907 | A1 | 3/2006 | Shiga et al. |
| 2006/0136448 | A1 | 6/2006 | Cialini et al. |
| 2006/0156059 | A1 | 7/2006 | Kitamura |
| 2006/0224603 | A1 | 10/2006 | Correll |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0234110 | A1 | 10/2007 | Soran et al. |
| 2007/0283167 | A1 | 12/2007 | Venters et al. |
| 2009/0094251 | A1 | 4/2009 | Gladwin et al. |
| 2009/0094318 | A1 | 4/2009 | Gladwin et al. |
| 2010/0023524 | A1 | 1/2010 | Gladwin et al. |
| 2010/0122020 | A1* | 5/2010 | Sikdar ...................... G06F 3/061 711/103 |
| 2013/0086337 | A1* | 4/2013 | Habeck ................. G06F 11/073 711/156 |
| 2013/0238900 | A1* | 9/2013 | Leggette ............. H04L 63/0428 713/165 |
| 2017/0093976 | A1* | 3/2017 | Raghunath .......... H04L 67/1097 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

(56) References Cited

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.
Zeilenga; Lightweight Directory Access Protocol (LDAP): Technical Specification Road Map; IETF Network Working Group; RFC 4510; Jun. 2006; pp. 1-8.
Zeilenga; Lightweight Directory Access Protocol (LDAP): String Representation of Distinguished Names; IETF Network Working Group; RFC 4514; Jun. 2006; pp. 1-15.
Sermersheim; Lightweight Directory Access Protocol (LDAP): The Protocol; IETF Network Working Group; RFC 4511; Jun. 2006; pp. 1-68.
Satran, et al.; Internet Small Computer Systems Interface (iSCSI); IETF Network Working Group; RFC 3720; Apr. 2004; pp. 1-257.
Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

\* cited by examiner

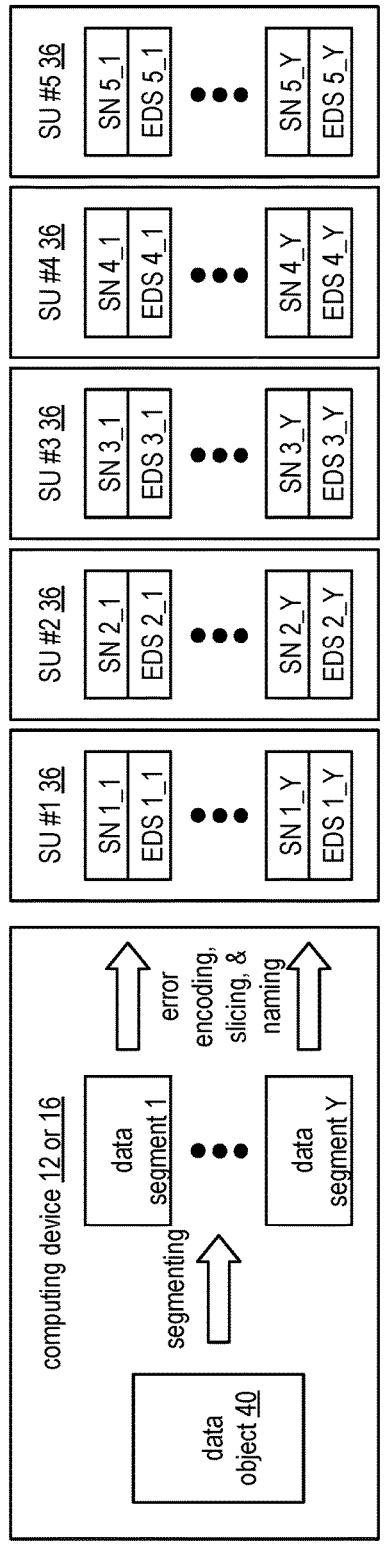
FIG. 3
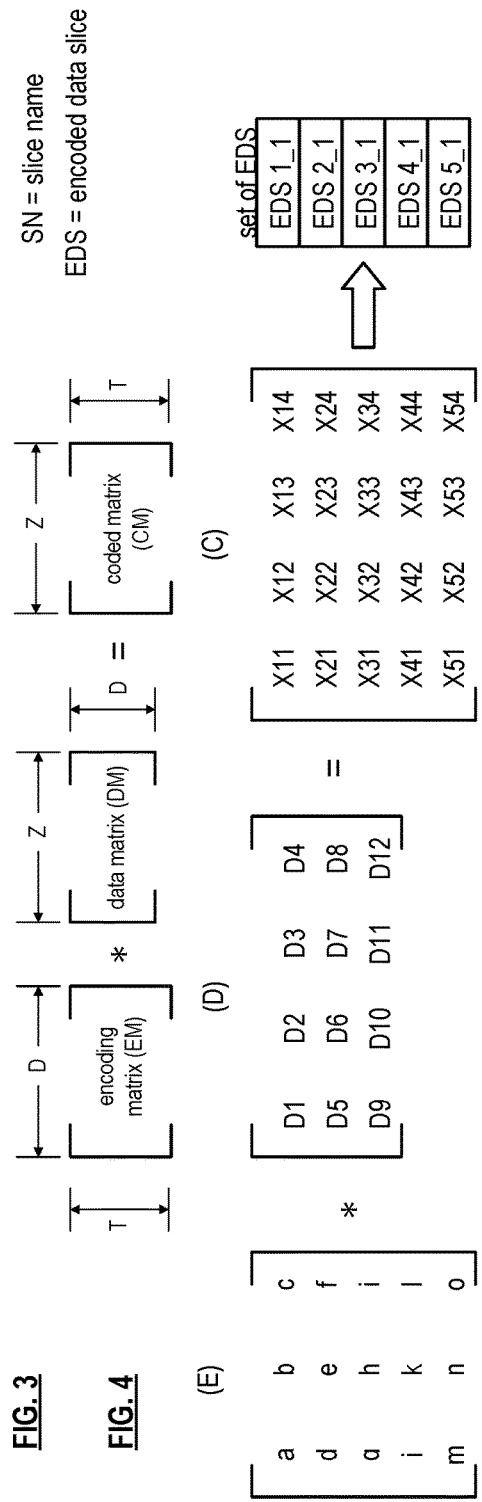
FIG. 4
FIG. 5
FIG. 6

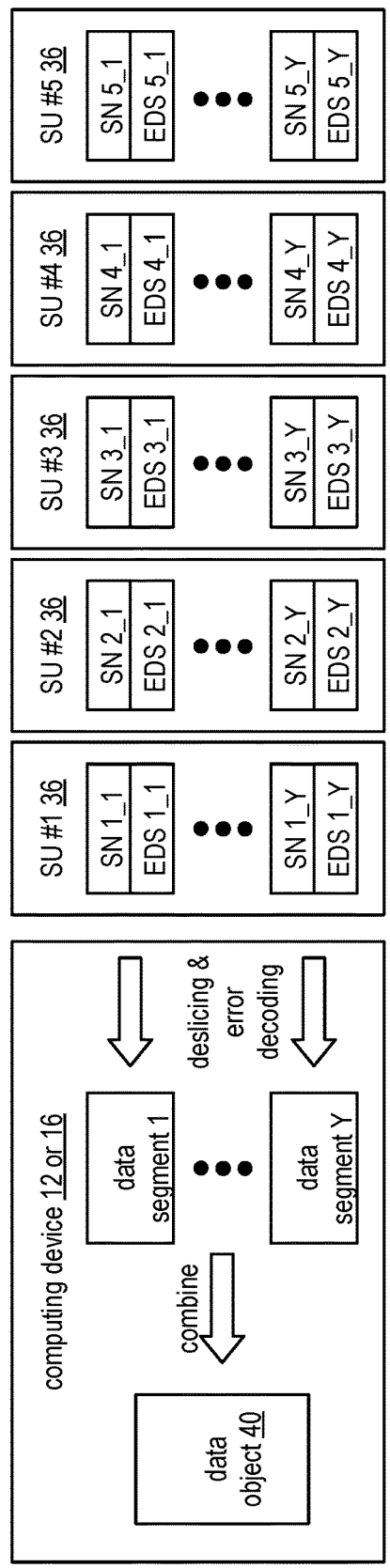

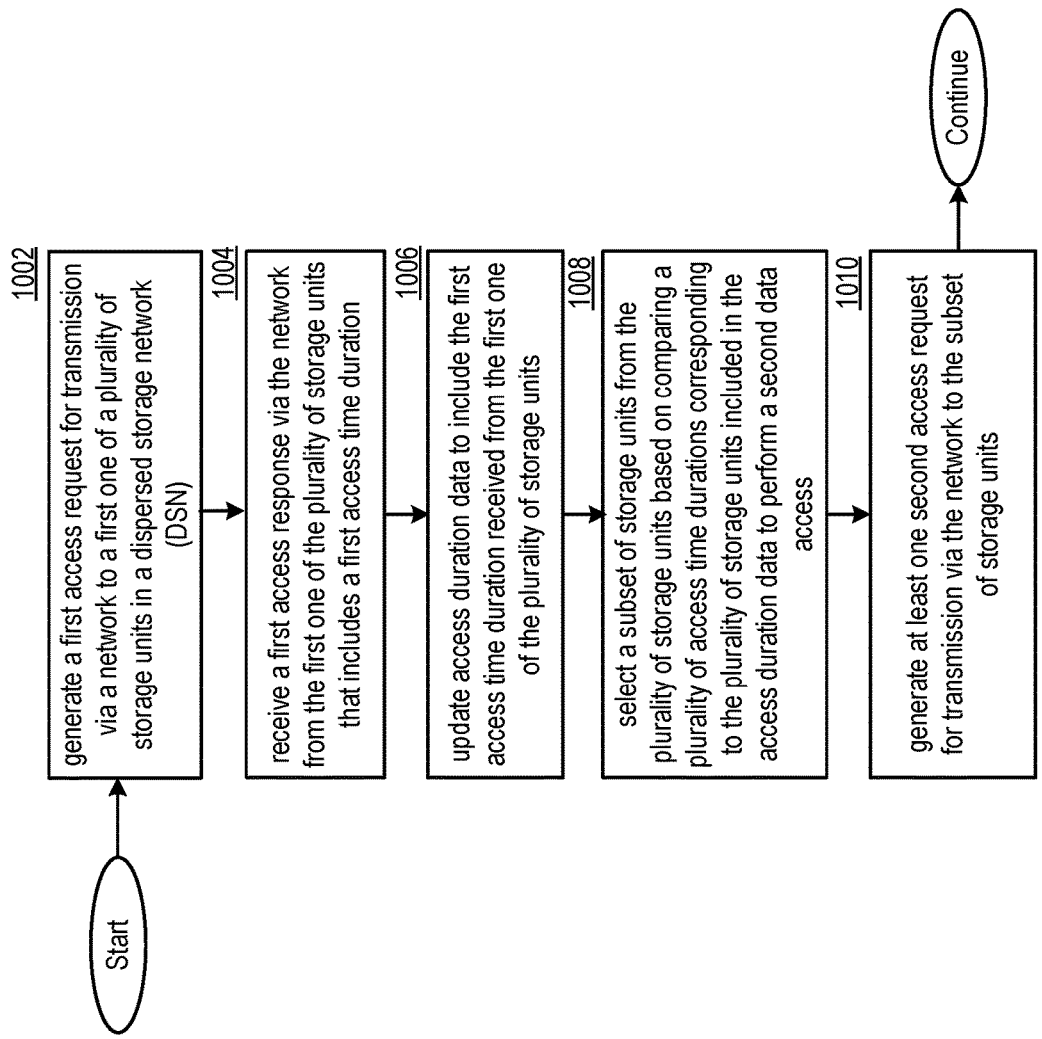

UTILIZING STORAGE UNIT LATENCY DATA IN A DISPERSED STORAGE NETWORK

CROSS-REFERENCE TO RELATED APPLICATIONS

The present U.S. Utility patent application claims priority pursuant to 35 U.S.C. § 119(e) to U.S. Provisional Application No. 62/248,752, entitled "MIGRATING DATA IN A DISPERSED STORAGE NETWORK", filed Oct. 30, 2015, which is hereby incorporated herein by reference in its entirety and made part of the present U.S. Utility patent application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

FIG. 7 is a schematic block diagram of an example of dispersed storage error decoding of data in accordance with the present invention;

FIG. 8 is a schematic block diagram of a generic example of an error decoding function in accordance with the present invention;

FIG. 10 is a logic diagram of an example of a method of utilizing storage unit latency data in accordance with the present invention.

DETAILED DESCRIPTION OF THE INVENTION

Figure 1:
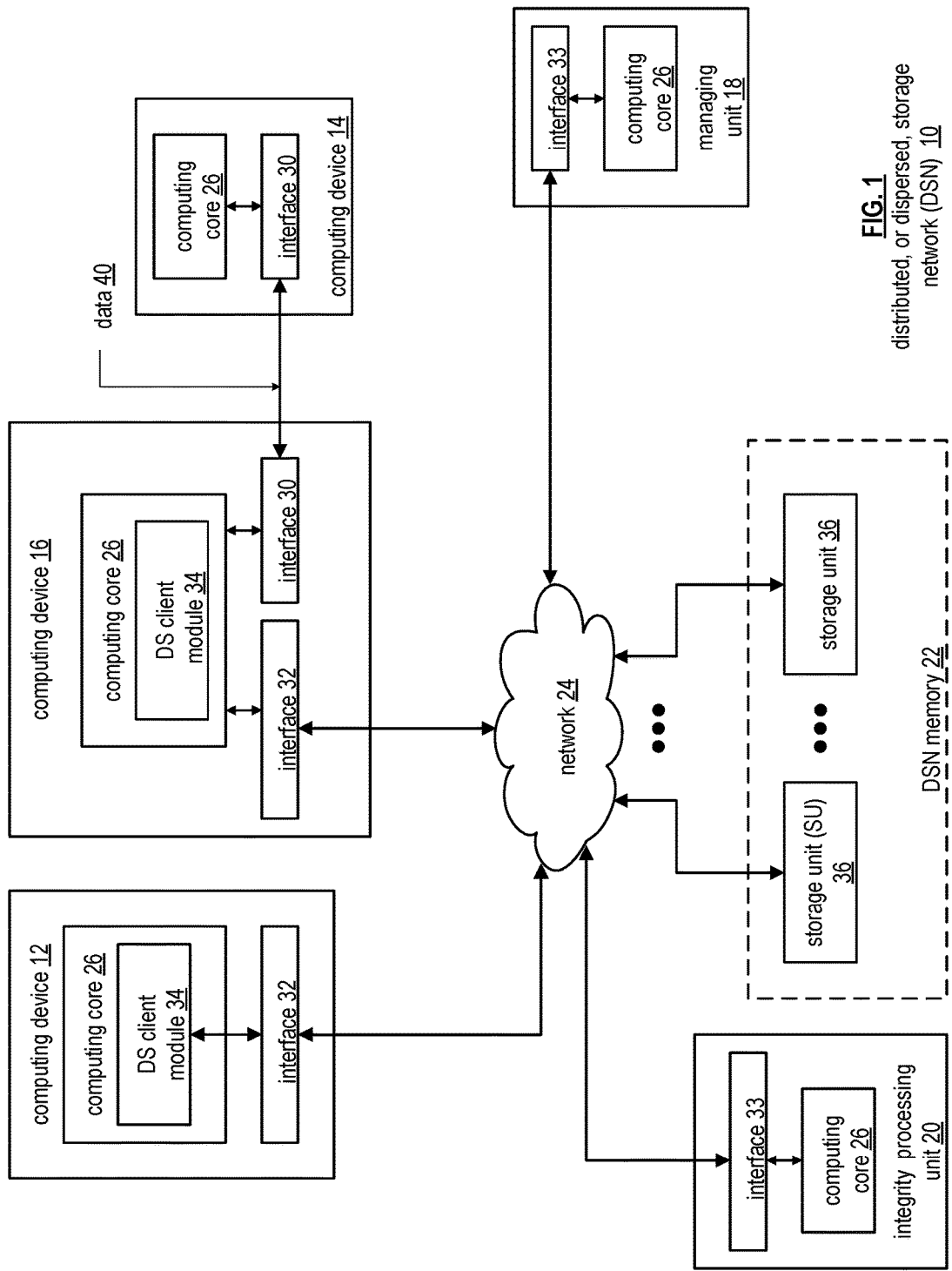
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
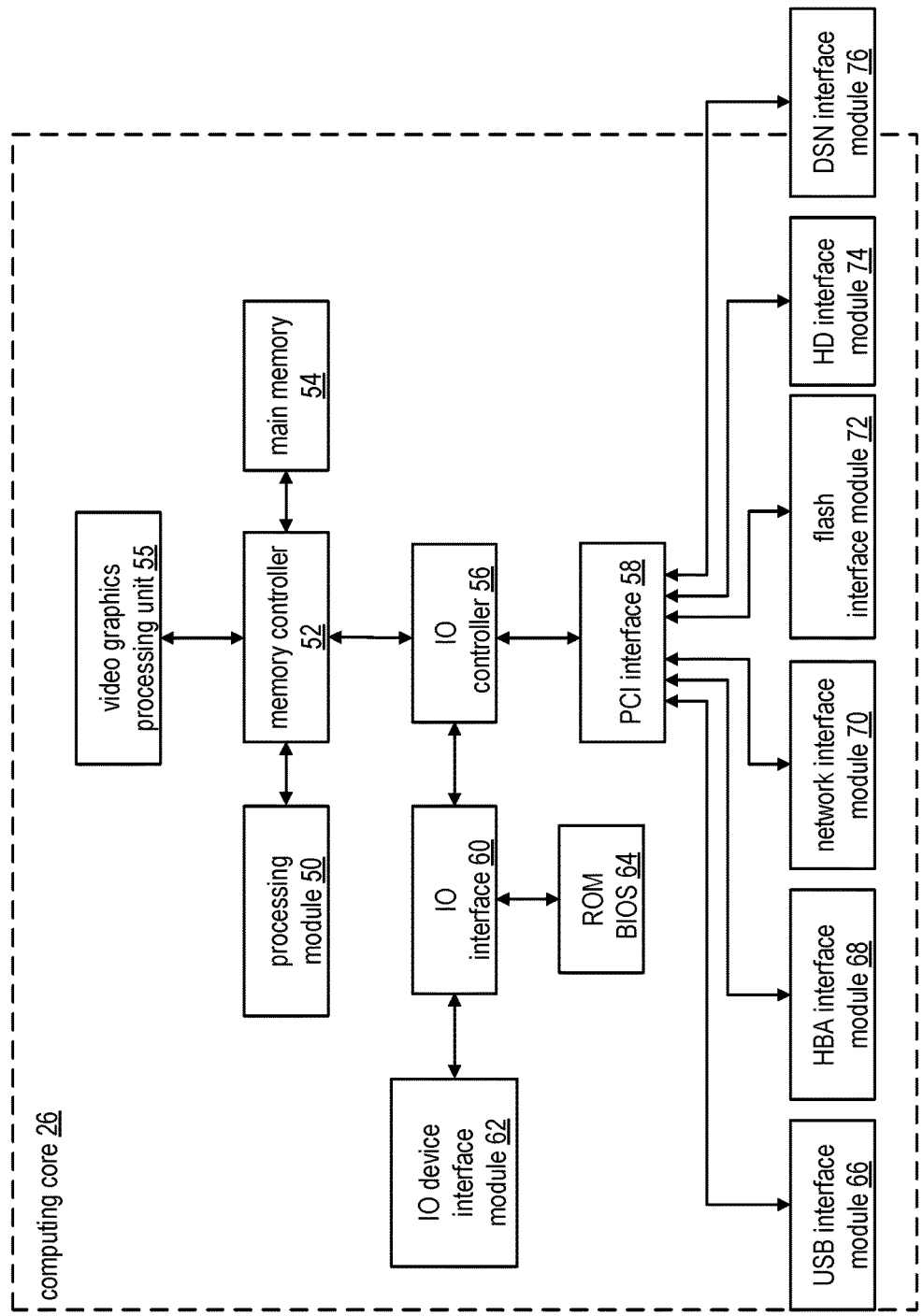
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

In various embodiments, each of the storage units operates as a distributed storage and task (DST) execution unit, and is operable to store dispersed error encoded data and/or to execute, in a distributed manner, one or more tasks on data. The tasks may be a simple function (e.g., a mathematical function, a logic function, an identify function, a find function, a search engine function, a replace function, etc.), a complex function (e.g., compression, human and/or computer language translation, text-to-voice conversion, voiceto-text conversion, etc.), multiple simple and/or complex functions, one or more algorithms, one or more applications, etc. Hereafter, a storage unit may be interchangeably referred to as a dispersed storage and task (DST) execution unit and a set of storage units may be interchangeably referred to as a set of DST execution units.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each managing unit 18 and the integrity processing unit 20 may be separate computing devices, may be a common computing device, and/or may be integrated into one or more of the computing devices 12-16 and/or into one or more of the storage units 36. In various embodiments, computing devices 12-16 can include user devices and/or can be utilized by a requesting entity generating access requests, which can include requests to read or write data to storage units in the DSN.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSN managing unit 18 tracks the number of times a user accesses a non-public vault and/or public vaults, which can be used to generate a per-access billing information. In another instance, the DSN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an 10 interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the 10 device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. Here, the computing device stores data object 40, which can include a file (e.g., text, video, audio, etc.), or other data arrangement. The dispersed storage error encoding parameters include an encoding function (e.g., information dispersal algorithm (IDA), Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides data object 40 into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
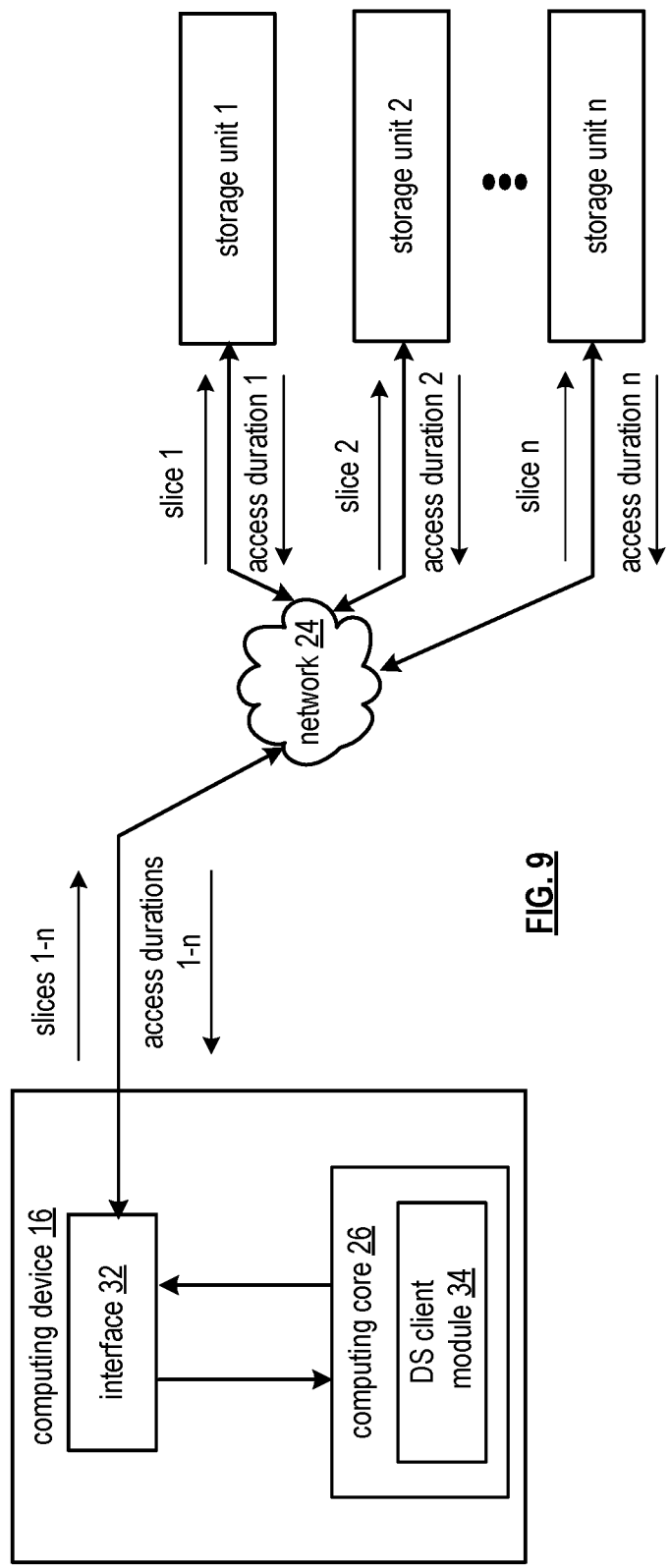
FIG. 9 is a schematic block diagram of an embodiment of a dispersed or distributed storage network (DSN) in accordance with the present invention.

FIG. 9 is a schematic block diagram of another embodiment of a dispersed storage network (DSN) that includes a computing device 16 of FIG. 1, the network 24 of FIG. 1, and a plurality of storage units 1-n. The computing device 16 can include the interface 32 of FIG. 1, the computing core 26 of FIG. 1, and the DS client module 34 of FIG. 1. The computing device 16 can function as a dispersed storage processing agent for computing device 14 as described previously, and may hereafter be interchangeably referred to as a distributed storage and task (DST) processing unit. Each storage unit may be implemented utilizing the storage unit 36 of FIG. 1, and can each function as a dispersed storage and task (DST) execution unit as described previously. The DSN functions to utilize storage unit latency data when executing access requests.

In various embodiments, a DST processing unit can make intelligent decisions when executing data access requests such as write requests, read requests, and/or task execution requests based on knowledge of which storage units are operating the best and fastest vs. which ones are operating the most slowly or are most burdened. The DST processing unit can take into account the total amount of time it took from when the DST processing unit issued the request and when the DST processing unit received a response. However, in various embodiments, this mechanism can conflate properties of the network such as latency, congestion, packet loss, etc., with actual behavior of one or more storage units executing the request.

In various embodiments, these two variables can be distinguished. Upon receiving a request from a DST processing unit via the network, the storage unit can record the time the request was received for processing. Then, after processing the request and assembling a response, the storage unit can record the time the response was generated. The storage unit can send both of these recorded times back as fields within the response (or alternatively, can send the difference between these times). The response can then be sent back to the DST processing unit that issued the request. The DST processing unit can thereby compare the actual processing time within each storage unit to other processing times of accesses. For example, the processing time of a storage unit can be compared to previous access times of the same storage unit or different units. The processing times of a plurality of storage units executing related requests at that time can also be compared, for example, a plurality of processing times corresponding to read and/or write requests for slices of a particular data object dispersed amongst the plurality of storage units.

The DST processing unit can store received access durations as access duration data, for example, in a log of access durations. The access duration data of past data access can be used when the DST processing unit is selecting a subset of storage units to utilize when executing a current access request. For example, a plurality of n write requests corresponding to n encoded slices of a data object can be sent to a subset of n storage units with fast previous access times, for example, the n storage units with the fastest access times. In various embodiments the number of storage units n may be based on an information dispersal algorithm (IDA) parameter such as a read threshold, write threshold, or column width.

In various embodiments, the type of access considered in determining which storage units will be utilized based on types of accesses corresponding the previous access durations in the access duration data. For example, the DST processing unit can choose to consider only access duration times corresponding to access types that match the current access type. In various embodiments, timestamps can be included in the access duration data, and the DST processing unit can further select storage units based on the timestamps. For example, the DST processing unit can choose to consider only access duration times corresponding to recent accesses of storage units. In various embodiments, the DST processing unit can periodically update the access duration data by removing access duration times that are older than a certain threshold, or to store only a subset of recent access duration times for each storage unit.

In various embodiments, a DST processing unit can utilize unique combination reads (UCR) when encoding a data object as a plurality of encoded data slices distributed amongst a plurality of storage units, and utilize the access duration data of the storage units when recovering the data object. The number of data slices needed to decode and regenerate the original data object is less than the total number of data slices stored for the object. In various embodiments, k slices are necessary to decode the object, and there are n slices total. In various embodiments, any combination of k slices can be used jointly to decode the object. Each combination of k slices for a data object can be assigned to a particular requesting entity, where the requesting entity can be, for example, a user device 12-14. In such cases, the combination of k slices assigned to the communicating for the data object can be a unique combination of read requests for the object if the total number of requesting entities does not exceed C(n,k), the total number of possible combinations of k slices from the total number of slices n. In various embodiments, the number of possible read combinations k can correspond to the number of users. In such embodiments where UCR is utilized, the DST processing unit can select the particular combination of k slices to be read based on previous access duration times corresponding to the n storage units. For example, the combination of k slices stored in the storage units with the fastest past access durations can be selected to be read.

In various embodiments, the access duration data can be used to detect storage units that are particularly slow, perhaps due to a problem that needs to be addressed. The DST processing unit can evaluate the access duration data to identify particularly slow storage units, and can generate a notification for transmission via the network, for example, to a user of the network. This information can be used by an entity that can then run diagnostics, repair, and/or replace one or more slow storage units. Slow storage units can be identified based on access duration times below a threshold, access duration times that are compared to a variation or standard deviation and declared statistically significant, etc.

In various embodiments, the received access duration times from the storage units included in access responses can aid the DST processing unit in determining the how much of the total time needed to process a request is due to network latency, and how much is due to latency within the storage unit itself. The DST processing unit, when provided start and end times from the DST unit, as discussed, can also compare latency of the network in sending the request. The DST processing unit can also compute latency of the network in sending the response, for example, when the DST processing unit and storage unit's clocks are synchronized. The DST processing unit can determine when network latency is less important than burden placed on the storage unit, such as when selecting storage units to perform rebuild work.

Furthermore, the DST processing unit can determine if the network latency overpowers the storage unit processing time, and can forego considering storage unit access durations if they are not significant with respect to the total access time. Similarly, the DST processing unit can determine if a variation amongst storage unit access duration times is significant with respect to the total access time, for example, by comparing a difference between slowest and fastest storage unit access times to the total access time, comparing a standard deviation of storage unit access times to the total access time, etc. The DST processing unit can determine a network latency significance score by comparing one or more access time durations included in the access duration data to the network latency, and if a network latency significance score compares unfavorably to a significance score threshold, indicating that that the network latency is less significant than the at least one of the plurality of access time durations, then the subset of storage units to be used for the access is selected based on of the plurality of access time durations indicated in the access duration data as discussed. In various embodiments, when the network latency significance score instead compares favorably to the significance score threshold, indicating that the network latency is more significant than the at least one of the plurality of access time durations, the subset of storage units can be selected independently of the plurality of access time durations. In various embodiments, the network latency is computed based on subtracting an average storage unit access duration or particular storage unit access duration from a total access duration determined by the DST processing unit based on access request transmission times and access response retrieval times. In various embodiments, a particular storage unit access duration used to compute network latency is computed based on a corresponding access type and/or a corresponding access timestamp.

In various embodiments, a processing system of a dispersed storage and task (DST) processing unit includes at least one processor and a memory that stores operational instructions, that when executed by the at least one processor cause the processing system to generate a first access request for transmission via a network to a first one of a plurality of storage units in a dispersed storage network (DSN). A first access response is received via the network from the first one of the plurality of storage units that includes a first access time duration. Access duration data is updated to include the first access time duration received from the first one of the plurality of storage units. A subset of storage units is selected from the plurality of storage units based on comparing a plurality of access time durations corresponding to the plurality of storage units included in the access duration data to perform a second data access. At least one second access request is generated for transmission via the network to the subset of storage units.

In various embodiments, the first access time duration is based on a difference between a first time that the first access request was received by the first one of the plurality of storage units and a second time that the first access response was generated by the first one of the plurality of storage units. In various embodiments, the subset of storage units is selected based on ranking the access time durations and including storage units with fastest ranked corresponding access time durations. In various embodiments, the size of the subset of storage units is based on an information dispersal algorithm (IDA) parameter. In various embodiments, the second data access corresponds to a read request, and the subset of storage units is further selected based on a unique combination reads (UCR) protocol.

In various embodiments, the access duration data further includes a plurality of access types corresponding to the plurality of access time durations. A subset of access time durations is selected from the plurality of access time durations by including access time durations that each correspond to a one of the plurality of access types that matches a data access type corresponding to the second data access. The subset of storage units is selected based on comparing only access time durations included in the subset of access time durations. In various embodiments, the access duration data includes a plurality of timestamps corresponding to the access time durations, and selecting the subset of storage units is further based on comparing the plurality of timestamps. In various embodiments, at least one of the plurality of storage units has a plurality of corresponding access time durations included in the access duration data. A subset of access time durations is selected from the plurality of access time durations by including a most recent of the plurality of corresponding access time durations for each of the at least one of the plurality of storage units. The subset of storage units is selected based on comparing only access time durations included in the subset of access time durations.

In various embodiments, latency data is generated that includes a network latency significance score by comparing at least one of the plurality of access time durations included in the access duration data to a network latency. The subset of storage units is selected based on the plurality of access time durations when the network latency significance score compares unfavorably to a threshold significance score, indicating that the network latency is less significant than the at least one of the plurality of access time durations. The subset of storage units is selected independently of the plurality of access time durations when the network latency significance score compares favorably to a threshold significance score, indicating that the network latency is more significant than the at least one of the plurality of access time durations. In various embodiments, the network latency significance score indicates that the network latency is more significant than the at least one of the plurality of access time durations when the network latency is greater than the at least one of the plurality of access time durations by at least a fixed significance factor. The network latency significance score indicates that the network latency is less significant than the at least one of the plurality of access time durations when the network latency is not greater than the at least one of the plurality of access time durations by at least the fixed significance factor. In various embodiments, the network latency is calculated by subtracting one of the plurality of access time durations that corresponds to one of a plurality of past accesses from a total time. The total time is determined by a difference between a first time that a past access request corresponding to the one of the plurality of past accesses was transmitted by the DST processing unit and a second time that a past access response corresponding to the one of the plurality of past accesses was received by the DST processing unit. In various embodiments, the one of the plurality of access time durations is selected to calculate the network latency based on a corresponding access type, a corresponding access timestamp, and/or an average access time duration associated with the plurality of access time durations.

In various embodiments, a slow storage unit subset of the plurality of storage units is selected by ranking the plurality of access time durations and including storage units with slowest ranked corresponding access time durations. A notification is generated for transmission via the network that indicates the slow storage unit subset. In various embodiments, selecting the slow storage unit subset includes selecting storage units with corresponding access times that are slower than a fixed access duration threshold.

FIG. 10 is a flowchart illustrating an example of functions to utilize storage unit latency data when executing access requests. In particular, a method is presented for use in association with one or more functions and features described in conjunction with FIGS. 1-9, for execution by a dispersed storage and task (DST) processing unit that includes a processor or via another processing system of a dispersed storage network that includes at least one processor and memory that stores instruction that configure the processor or processors to perform the steps described below. Step 1002 includes generating a first access request for transmission via a network to a first one of a plurality of storage units in a dispersed storage network (DSN). Step 1004 includes receiving a first access response via the network from the first one of the plurality of storage units that includes a first access time duration. Step 1006 includes updating access duration data to include the first access time duration received from the first one of the plurality of storage units. Step 1008 includes selecting a subset of storage units from the plurality of storage units based on comparing a plurality of access time durations corresponding to the plurality of storage units included in the access duration data to perform a second data access. Step 1010 includes generating at least one second access request for transmission via the network to the subset of storage units.

In various embodiments, the first access time duration is based on a difference between a first time that the first access request was received by the first one of the plurality of storage units and a second time that the first access response was generated by the first one of the plurality of storage units. In various embodiments, the subset of storage units is selected based on ranking the access time durations and including storage units with fastest ranked corresponding access time durations. In various embodiments, the size of the subset of storage units is based on an information dispersal algorithm (IDA) parameter. In various embodiments, the second data access corresponds to a read request, and the subset of storage units is further selected based on a unique combination reads (UCR) protocol.

In various embodiments, the access duration data further includes a plurality of access types corresponding to the plurality of access time durations. A subset of access time durations is selected from the plurality of access time durations by including access time durations that each correspond to a one of the plurality of access types that matches a data access type corresponding to the second data access. The subset of storage units is selected based on comparing only access time durations included in the subset of access time durations. In various embodiments, the access duration data includes a plurality of timestamps corresponding to the access time durations, and selecting the subset of storage units is further based on comparing the plurality of timestamps. In various embodiments, at least one of the plurality of storage units has a plurality of corresponding access time durations included in the access duration data. A subset of access time durations is selected from the plurality of access time durations by including a most recent of the plurality of corresponding access time durations for each of the at least one of the plurality of storage units. The subset of storage units is selected based on comparing only access time durations included in the subset of access time durations.

In various embodiments, latency data is generated that includes a network latency significance score by comparing at least one of the plurality of access time durations included in the access duration data to a network latency. The subset of storage units is selected based on the plurality of access time durations when the network latency significance score compares unfavorably to a threshold significance score, indicating that the network latency is less significant than the at least one of the plurality of access time durations. The subset of storage units is selected independently of the plurality of access time durations when the network latency significance score compares favorably to a threshold significance score, indicating that the network latency is more significant than the at least one of the plurality of access time durations. In various embodiments, the network latency significance score indicates that the network latency is more significant than the at least one of the plurality of access time durations when the network latency is greater than the at least one of the plurality of access time durations by at least a fixed significance factor. The network latency significance score indicates that the network latency is less significant than the at least one of the plurality of access time durations when the network latency is not greater than the at least one of the plurality of access time durations by at least the fixed significance factor. In various embodiments, the network latency is calculated by subtracting one of the plurality of access time durations that corresponds to one of a plurality of past accesses from a total time. The total time is determined by a difference between a first time that a past access request corresponding to the one of the plurality of past accesses was transmitted by the DST processing unit and a second time that a past access response corresponding to the one of the plurality of past accesses was received by the DST processing unit. In various embodiments, the one of the plurality of access time durations is selected to calculate the network latency based on a corresponding access type, a corresponding access timestamp, and/or an average access time duration associated with the plurality of access time durations.

In various embodiments, a slow storage unit subset of the plurality of storage units is selected by ranking the plurality of access time durations and including storage units with slowest ranked corresponding access time durations. A notification is generated for transmission via the network that indicates the slow storage unit subset. In various embodiments, selecting the slow storage unit subset includes selecting storage units with corresponding access times that are slower than a fixed access duration threshold.

In various embodiments, a non-transitory computer readable storage medium includes at least one memory section that stores operational instructions that, when executed by a processing system of a dispersed storage network (DSN) that includes a processor and a memory, causes the processing system to generate a first access request for transmission via a network to a first one of a plurality of storage units in a dispersed storage network (DSN). A first access response is received via the network from the first one of the plurality of storage units that includes a first access time duration. Access duration data is updated to include the first access time duration received from the first one of the plurality of storage units. A subset of storage units is selected from the plurality of storage units based on comparing a plurality of access time durations corresponding to the plurality of storage units included in the access duration data to perform a second data access. At least one second access request is generated for transmission via the network to the subset of storage units.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by a dispersed storage and task (DST) processing unit that includes a processor, the method comprises:
   generating a first access request for transmission via a network to a first one of a plurality of storage units in a dispersed storage network (DSN);
   receiving a first access response via the network from the first one of the plurality of storage units that includes a first access time duration;
   updating access duration data to include the first access time duration received from the first one of the plurality of storage units;
   selecting a subset of storage units from the plurality of storage units based on comparing a plurality of access time durations corresponding to the plurality of storage units included in the access duration data to perform a second data access;
   generating at least one second access request for transmission via the network to the subset of storage units;
   calculating network latency by subtracting one of the plurality of access time durations that corresponds to one of a plurality of past accesses from a total time, wherein the one of the plurality of access time durations is selected to calculate the network latency based on a corresponding access type and corresponding access timestamp; and
   generating latency data that includes a network latency significance score by comparing at least one of the plurality of access time durations included in the access duration data to the network latency;
   wherein the subset of storage units is selected based on the plurality of access time durations when the network latency significance score compares unfavorably to a threshold significance score, whereby the network latency is less significant than the at least one of the plurality of access time durations;
   wherein the subset of storage units is selected independently of the plurality of access time durations when the network latency significance score compares favorably to the threshold significance score, whereby the network latency is more significant than the at least one of the plurality of access time durations; and
   wherein the total time is determined by a difference between a first time that a past access request corresponding to the one of the plurality of past accesses was transmitted by the DST processing unit and a second time that a past access response corresponding to the one of the plurality of past accesses was received by the DST processing unit.

2. The method of claim 1, wherein the first access time duration is based on a difference between a first time that the first access request was received by the first one of the plurality of storage units and a second time that the first access response was generated by the first one of the plurality of storage units.

3. The method of claim 1, wherein the subset of storage units is selected based on ranking the access time durations and including storage units with fastest ranked corresponding access time durations.

4. The method of claim 1, wherein a size of the subset of storage units is based on an information dispersal algorithm (IDA) parameter.

5. The method of claim 1, wherein the access duration data further includes a plurality of access types corresponding to the plurality of access time durations, further comprising:
   selecting a subset of access time durations from the plurality of access time durations by including access time durations that each correspond to a one of the plurality of access types that matches a data access type corresponding to the second data access;
   wherein the subset of storage units is selected based on comparing only access time durations included in the subset of access time durations.

6. The method of claim 1, wherein the access duration data includes a plurality of timestamps corresponding to the access time durations, and wherein selecting the subset of storage units is further based on comparing the plurality of timestamps.

7. The method of claim 6, wherein at least one of the plurality of storage units has a plurality of corresponding access time durations included in the access duration data, further comprising:
   selecting a subset of access time durations from the plurality of access time durations by including a most recent of the plurality of corresponding access time durations for each of the at least one of the plurality of storage units;
   wherein the subset of storage units is selected based on comparing only access time durations included in the subset of access time durations.

8. The method of claim 1, wherein the network latency significance score indicates that the network latency is more significant than the at least one of the plurality of access time durations when the network latency is greater than the at least one of the plurality of access time durations by at least a fixed significance factor, and wherein the network latency significance score indicates that the network latency is less significant than the at least one of the plurality of access time durations when the network latency is not greater than the at least one of the plurality of access time durations by at least the fixed significance factor.

9. The method of claim 1, wherein the one of the plurality of access time durations is selected further based on an average access time duration associated with the plurality of access time durations.

10. The method of claim 1, further comprising:
selecting a slow storage unit subset of the plurality of storage units by ranking the plurality of access time durations and including storage units with slowest ranked corresponding access time durations; and
generating a notification for transmission via the network indicating the slow storage unit subset.

11. The method of claim 10, wherein selecting the slow storage unit subset includes selecting storage units with corresponding access times that are slower than a fixed access duration threshold.

12. The method of claim 1, wherein the second data access corresponds to a read request, and wherein the subset of storage units is further selected based on a unique combination reads (UCR) protocol.

13. A processing system of a dispersed storage and task (DST) processing unit comprises:
at least one processor;
a memory that stores operational instructions, that when executed by the at least one processor cause the processing system to:
generate a first access request for transmission via a network to a first one of a plurality of storage units in a dispersed storage network (DSN);
receive a first access response via the network from the first one of the plurality of storage units that includes a first access time duration;
update access duration data to include the first access time duration received from the first one of the plurality of storage units;
select a subset of storage units from the plurality of storage units based on comparing a plurality of access time durations corresponding to the plurality of storage units included in the access duration data to perform a second data access;
generate at least one second access request for transmission via the network to the subset of storage units;
calculate network latency by subtracting one of the plurality of access time durations that corresponds to one of a plurality of past accesses from a total time, wherein the one of the plurality of access time durations is selected to calculate the network latency based on a corresponding access type and corresponding access timestamp; and
generate latency data that includes a network latency significance score by comparing at least one of the plurality of access time durations included in the access duration data to the network latency;
wherein the subset of storage units is selected based on the plurality of access time durations when the network latency significance score compares unfavorably to a threshold significance score, whereby the network latency is less significant than the at least one of the plurality of access time durations;
wherein the subset of storage units is selected independently of the plurality of access time durations when the network latency significance score compares favorably to the threshold significance score, whereby the network latency is more significant than the at least one of the plurality of access time durations; and
wherein the total time is determined by a difference between a first time that a past access request corresponding to the one of the plurality of past accesses was transmitted by the DST processing unit and a second time that a past access response corresponding to the one of the plurality of past accesses was received by the DST processing unit.

14. The processing system of claim 13, wherein the first access time duration is based on a difference between a first time that the first access request was received by the first one of the plurality of storage units and a second time that the first access response was generated by the first one of the plurality of storage units.

15. The processing system of claim 13, wherein the access duration data further includes a plurality of access types corresponding to the plurality of access time durations, and wherein the operation instructions, when executed by the at least one processor, further cause the processing system to:
select a subset of access time durations from the plurality of access time durations by including access time durations that each correspond to a one of the plurality of access types that matches a data access type corresponding to the second data access;
wherein the subset of storage units is selected based on comparing only access time durations included in the subset of access time durations.

16. The processing system of claim 13, wherein the operation instructions, when executed by the at least one processor, further cause the processing system to:
select a slow storage unit subset of the plurality of storage units by ranking the plurality of access time durations and including storage units with slowest ranked corresponding access time durations; and
generate a notification for transmission via the network indicating the slow storage unit subset.

17. A non-transitory computer readable storage medium comprises:
at least one memory section that stores operational instructions that, when executed by a processing system of a dispersed storage network (DSN) that includes a processor and a memory, causes the processing system to:
generate a first access request for transmission via a network to a first one of a plurality of storage units in the DSN;
receive a first access response via the network from the first one of the plurality of storage units that includes a first access time duration;
update access duration data to include the first access time duration received from the first one of the plurality of storage units;
select a subset of storage units from the plurality of storage units based on comparing a plurality of access time durations corresponding to the plurality of storage units included in the access duration data to perform a second data access;
generate at least one second access request for transmission via the network to the subset of storage units;
calculate network latency by subtracting one of the plurality of access time durations that corresponds to one of a plurality of past accesses from a total time, wherein the one of the plurality of access time durations is selected to calculate the network latency based on a corresponding access type and corresponding access timestamp; and generate latency data that includes a network latency significance score by comparing at least one of the plurality of access time durations included in the access duration data to the network latency;

wherein the subset of storage units is selected based on the plurality of access time durations when the network latency significance score compares unfavorably to a threshold significance score, whereby the network latency is less significant than the at least one of the plurality of access time durations;

wherein the subset of storage units is selected independently of the plurality of access time durations when the network latency significance score compares favorably to the threshold significance score, whereby the network latency is more significant than the at least one of the plurality of access time durations; and wherein the total time is determined by a difference between a first time that a past access request corresponding to the one of the plurality of past accesses was transmitted by the DST processing unit and a second time that a past access response corresponding to the one of the plurality of past accesses was received by the DST processing unit.

* * * * *